United States Patent [19]

Patron et al.

[11] Patent Number: 4,897,619
[45] Date of Patent: Jan. 30, 1990

[54] HIGH-FREQUENCY GENERATOR

[75] Inventors: Christian S. A. E. Patron; Eugene J. Sowinski; Aart P. Huben, all of Eindhoven, Netherlands

[73] Assignee: U.S. Philips Corporation, New York, N.Y.

[21] Appl. No.: 218,015

[22] Filed: Jul. 12, 1988

[30] Foreign Application Priority Data

Jul. 16, 1987 [NL] Netherlands .................. 8701679

[51] Int. Cl.⁴ .................................... H03J 3/00
[52] U.S. Cl. .................................... 331/167; 328/225; 328/226
[58] Field of Search ................. 328/225, 226; 331/167

[56] References Cited
U.S. PATENT DOCUMENTS 2,577,454 12/1951 Diemer ............................ 331/167
2,591,940 4/1952 Hugenholtz ..................... 331/167
3,268,822 8/1966 Hickey ............................. 328/225

FOREIGN PATENT DOCUMENTS 0115008 6/1926 Switzerland ................... 328/225

Primary Examiner—John S. Heyman
Attorney, Agent, or Firm—Bernard Franzblau

[57] ABSTRACT

In a high-frequency generator (1) comprising a multigrid electron tube (2), the control grid (3) and the screen grid (4) are substantially d.c. coupled. The tube then oscillates via the internal parasitic capacitance between the screen grid (4) and anode (5) without requiring an external feedback circuit. A reduction of the heat dissipation and a compact electron tube are the result with high oscillation frequencies likewise being attainable. A high-frequency decoupling of the control grid (3), with an intermittent operation of the generator (1), results in a very limited heat dissipation, causing the generator (1) to be very compact.

16 Claims, 1 Drawing Sheet

HIGH-FREQUENCY GENERATOR

BACKGROUND OF THE INVENTION

This invention relates to a high-frequency generator, comprising a multigrid electron tube including at least a grid pair consisting of a control grid and a screen grid, a power supply circuit and a load, the grid pair being coupled to the main current path of the electron tube, and comprising between the screen grid and the anode a feedback circuit for generating a high-frequency signal in the main current path of the electron tube.

Such a high-frequency generator, which finds application in industry, for example, in high-frequency heating, is widely known. In the known high-frequency generator the grid pair, that is to say the screen grid connected to a positive voltage, takes up current so that the efficiency of the power dissipated in the load remains relatively low. The absolute value of the power dissipated by the grid pair in the electron tube, which power does not go to the load, is considerable; especially in high-frequency generators for industrial applications which operate in the power range from several kilowatts to a number of megawatts. Owing to the heat dissipation in the electron tube, this power loss imposes constructional restrictions on the attainable compactness of the electron tube for such applications.

SUMMARY OF THE INVENTION

It is an object of the invention to provide measures for enhancing the efficiency in the electron tube which thus makes possible the construction of compact high-frequency generators.

Thereto, the invention provides a high-frequency generator, of the type mentioned in the preamble, whose first embodiment is characterized in that the feedback circuit is substantially formed by the internal parasitic capacitance which is present between the screen grid and the anode of the electron tube, and in that the high-frequency generator comprises, between the control grid and the screen grid, an impedance element whose a.c. resistance with respect to the high-frequency signal exceeds the d.c. resistance.

By substantially d.c. coupling the two grids of the grid pair, the control grid and the screen grid carry a generally negative d.c. voltage relative to the cathode of the electron tube. Consequently, the effect of the anode attraction on the electron cloud in the tube is enhanced and the chance of the electrons originating from the cathode reaching the screen grid are reduced, so that the screen grid takes up no more than a slight current. Owing to an attendant low screen grid dissipation, the compactness of the electron tube and hence the high-frequency generator is enhanced or, on the other hand, with the same compactness, owing to a reduction in the electron tube of the power loss due to dissipation, the electron tube is made suitable for applications in which high energy is required, such as, for example transmitter tube circuits, high-frequency heating or laser control circuits.

By also a.c. isolating the grids of the grid pair, the parasitic capacitance in the electron tube between the screen grid and the anode can be used advantageously. More specifically, in the frequency range from, let us say a hundred kilohertz, an external connection from a feedback circuit to the electron tube can be omitted, leading to a further enhancement of the compactness of the high-frequency generator according to the invention.

High frequencies of the order of several kilohertz or higher appear to be attainable in practice with the high-frequency generator according to the invention.

A second simple embodiment of the high-frequency generator according to the invention is characterized in that the impedance element comprises a coil.

A third embodiment of the high-frequency generator according to the invention is characterized in that the high-frequency generator comprises, between the control grid and a point of common supply-voltage, a decoupling element for decoupling the control grid with respect to the high-frequency signal.

The combination of the d.c. coupling of the two grids of the grid pair and the decoupling of the control grid for the high-frequency signal enables the electron tube to supply to the load for short time intervals either the full power or no power, when the electron tube is operated intermittently.

A fourth simple embodiment of the high-frequency generator according to the invention is characterized in that the decoupling element comprises a capacitor.

A fifth embodiment of the high-frequency generator according to the invention is characterized in that the high-frequency generator comprises a control element having a control input. The control element is coupled between the control grid and a point of common supply-voltage for instantaneously affecting the current in the main current path of the elctron tube in response to a control voltage at the control input.

A sixth simple embodiment of the high-frequency generator according to the invention is characterized in that the control element comprises a semiconductor element with a control electrode, a first resistor and a second resistor. The first resistor is serially connected to the main current path of the semiconductor element, the series arrangement being inserted between the control grid and the point of common supply-voltage. Furthermore, the control electrode of the semiconductor element is connected to the control input of the control element and the second resistor is connected on one side to a negative voltage source and on the other side to the junction between the main current path of the electron tube and the first resistor.

In this sixth embodiment the high-frequency generator according to the invention is preeminently suitable for intermittent operation. Since the grids of the grid pair take up a small current only during short time intervals when being operated intermittently, the heat dissipation is further restricted and the achievable compactness of the high-frequency generator further enhanced.

BRIEF DESCRIPTION OF THE DRAWING

The invention and its advantages will be further explained with reference to the accompanying drawings in which.

DESCRIPTION OF THE PREFERRED EMBODIMENTS

Figure 1:
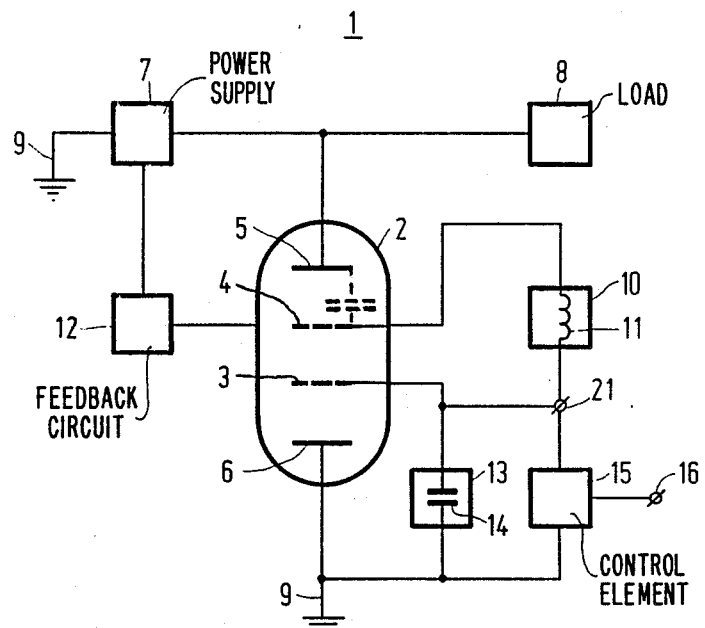
FIG. 1 shows a possible embodiment of the high-frequency generator according to the invention.

In FIG. 1 a high-frequency generator 1 is represented which is used in industrial processes such as high-frequency heating, for example, for the production of optical fibres such as glass fibres. The generator is further used in transmitter tube circuits or to drive lasers, for example.

The generator 1 comprises a multigrid electron tube 2, such as a tetrode represented in FIG. 1 or a similar multigrid electron tube, such as a pentode, a hexode, a heptode, an octode etcetera. The electron tube 2 at least comprises a grid pair composed of a control grid 3 and a screen grid 4, an anode 5 and a cathode 6. The generator 1 comprises a power supply circuit 7 providing a supply voltage for the electron tube 2 and comprises a load 8. The power supply circuit 7 and the load 8 are both connected to anode 5 in FIG. 1. The power supply circuit 7 is further connected to a point 9 of common supply-voltage. The load is formed, for example, by one or a plurality of work coils (not shown). The cathode 6 is coupled to point 9 in FIG. 1.

Between the control grid 3 and the screen grid 4 an impedance element 10 is inserted which, for example, comprises a coil 11 or a series circuit (not shown) of a resistor and the coil 11. The impedance of the element 10 is such that the a.c. resistance with respect to a high-frequency signal to be discussed presently exceeds the d.c. resistance. The control grid 3 and the screen grid 4 are thus substantially d.c. coupled, but a.c. isolated.

Generally, a known high-frequency generator 1 comprises a feedback circuit 12 for producing oscillations in the form of a high-frequency signal in the main current path of the electron tube 2, this circuit being externally connected to the screen grid 4 and through the power supply circuit 7 to the main current path of the electron tube 2. One advantage of the embodiment of the generator 1 represented in FIG. 1 is that an external connection to the electron tube 2 of the feedback circuit 12 can be omitted, if so desired, as the feedback circuit can be formed by only the internal parasitic capacitance between the screen grid 4 and the anode 5 of the electron tube 2. Consequently, the generator 1 can be more compact and constructed with a minimum number of the components. In practice, with this embodiment of generator 1, it appears that a high-frequency signal can be generated having a relatively high frequency, for example, of the order of several kilohertz or over.

The d.c. coupled grids 3 and 4 are maintained at a generally negative d.c. voltage with respect to cathode 6, with the aid of means which are known per se and not represented in FIG. 1. A negatively charged electron cloud moving from the cathode 6 to the anode 5 experiences the relatively strong influence of the positive anode 5 when passing the negatively charged screen grid 4. Therefore, the chance of the electrons reaching the screen grid 4 is very slim. Consequently, the screen grid 4 takes up very little current so that the screen grid dissipation becomes very small and the structure of the electron tube 2 and hence generator 1 can be even more compact.

In a further embodiment the high-frequency generator 1 comprises a decoupling element 13 inserted between the control grid 3 and a point 9 of common supply voltage for decoupling the control grid 3 with respect to the high-frequency signal. The decoupling element 13 comprises, for example, a capacitor 14 or, for example, a series circuit (not shown in the Figure) of a resistor and the capacitor 14. When the electron tube 2 is operated intermittently, supplying during short time intervals either the full power or no power to the load 8, the grid pair 3, 4 takes up a current, be it small, during these short time intervals. Consequently, the heat dissipation in the electron tube 2 is even further restricted and hence the attainable compactness of the generator 1 further enhanced.

The high-frequency generator 1 in a further embodiment comprises a control element 15 inserted between the control grid and the point 9. The control element 15 has a control input 16. By means of a control voltage to be applied to the control input 16, the current in the main current path of the electron tube 2 can be influenced instantaneously.

Figure 2:
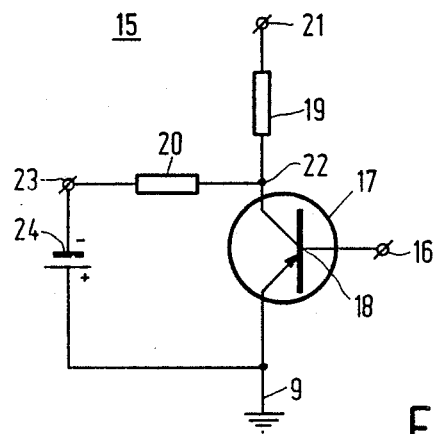
FIG. 2 shows a detailed diagram of a control element to be used in the high-frequency generator which is shown in FIG. 1.

FIG. 2 shows a detailed diagram of a control element 15 to be used in the high-frequency generator 1. The control element 15 comprises a semiconductor element 17 with a control electrode 18, a first resistor 19 and a second resistor 20. The semiconductor element 17 of FIG. 2 is symbolically represented in the form of a transistor. If so desired, a thyristor or a triac or the like may be chosen instead. The resistor 19 is serially connected to the main current path of the semiconductor element 17. The series arrangement 17, 19 is connected between the point 9 and the control grid 3 through a terminal 21. The resistor 20 is connected on the one side to the junction 22 of the series arrangement 17, 19 and on the other side to the negative terminal 23 of a voltage source 24. By connecting a bivalent control voltage to the control input 16, the semiconductor element 17 is turned off during a first part of the interval with a first value of the control voltage, so that the grid pair 3, 4 receives through the resistors 20 and 19 a negative potential from the negative terminal 21. The screen grid 4 receives this potential via the impedance element 10. During the second part of the interval with the second value of the control voltage, the semiconductor element 17 is conductive and the grid pair 3, 4 is driven via the resistor 19 to a voltage corresponding to the ground potential at point 9. With the obtained alternating potential of the grid pair 3, 4 the electron tube 2 is intermittently driven so that it supplies either the full power or no power to load 8.

What is claimed is:

1. A high-frequency generator comprising: a multigrid electron tube comprising at least a cathode, an anode and a grid pair including a control grid and a screen grid, a power supply circuit coupled to said anode and cathode, means coupling said tube to a load, the grid pair being coupled to a main current path of the electron tube, a feedback circuit between the screen grid and the anode for generating a high-frequency signal in the main current path of the electron tube, characterized in that the feedback circuit substantially comprises an internal parasitic capacitance present between the screen grid and the anode of the electron tube, and an impedance element coupled between the control grid and the screen grid, said impedance element having an a.c. impedance with respect to the high-frequency signal that exceeds its d.c. resistance.

2. A high-frequency generator as claimed in claim 1, wherein the impedance element comprises a coil.

3. A high-frequency generator as claimed in claim 1, wherein the high-frequency generator comprises a decoupling element between the control grid and a point of common supply voltage, said decoupling element decoupling the control grid with respect to the high-frequency signal.

4. A high-frequency generator as claimed in claim 3, wherein the decoupling element comprises a capacitor.

5. A high-frequency generator as claimed in claim 3 wherein the high-frequency generator comprises a control element having a control input, means coupling the control element between the control grid and a point of common supply-voltage for instantaneously affecting the current in the main current path of the electron tube in dependence on a control voltage at the control input.

6. A high-frequency generator as claimed in claim 5, characterized in that the control element comprise a semiconductor element with a control electrode, a first resistor, a second resistor, means connecting the first resistor in a series arrangement with the main current path of the semiconductor element between the control grid and the point of common supply-voltage, wherein the control electrode of the semiconductor element is connected to the control input of the control element, and means connecting the second resistor between a negative voltage source and a junction between the main current path of the electron tube and the first resistor.

7. A high-frequency generator as claimed in claim 2, wherein the high-frequency generator comprises a decoupling element connected between the control grid and a point of common supply voltage, said decoupling element decoupling the control grid with respect to the high-frequency signal.

8. A high-frequency generator as claimed in claim 4, wherein the high-frequency generator comprises a control element having a control input, means coupling the control element between the control grid and a point of common supply voltage for instantaneously affecting the current in the main current path of the electron tube in dependence on a control voltage at the control input.

9. A high-frequency generator comprising:
a multigrid electron tube including a cathode and an anode which define a main current path in the tube, a control grid and a screen grid coupled to said main current path,
first means for coupling said anode and cathode to a source of supply voltage for the tube,
a feedback circuit between the screen grid and the anode for generating a high-frequency signal in the main current path of the tube, wherein said feedback circuit substantially comprises an internal parasitic capacitance present between the screen grid and the anode of the tube, and
second means including an impedance element for coupling the control grid to the screen grid in a manner such that said control grid and said screen grid are each at substantially the same DC voltage level relative to the cathode, said impedance element having an AC impedance for said high-frequency that exceeds its DC resistance.

10. A high-frequency generator as claimed in claim 9, further comprising means for coupling at least one of said grids to a point of negative voltage such that each of said grids is at a negative DC voltage relative to the cathode of the tube.

11. A high-frequency generator as claimed in claim 9, wherein said impedance element comprises an inductor.

12. A high-frequency generator as claimed in claim 9, further comprising a bidirectional high-frequency decoupling element connected between the control grid and a common point of said supply voltage.

13. A high-frequency generator as claimed in claim 9, further comprising a high-frequency decoupling capacitor connected between the control grid and the tube cathode.

14. A high-frequency generator as claimed in claim 13, further comprising a control element connected in parallel with said decoupling capacitor between the control grid and cathode, and
means coupling a control input of the control element to a terminal for a control voltage so as to instantaneously control the current in said main current path as a function of the control voltage.

15. A high-frequency generator as claimed in claim 14, wherein said control element comprises:
a first resistor and a transistor connected in series between the control grid and cathode,
a second resistor connected between a junction point of the first resistor and the transistor and a point of negative DC voltage, and
means connecting a control electrode of the transistor to said control input.

16. A high-frequency generator as claimed in claim 9, wherein said impedance element comprises an inductor and said second coupling means is devoid of any DC voltage source.

* * * * *